(12) United States Patent
Park et al.

(10) Patent No.: US 6,465,831 B1
(45) Date of Patent: Oct. 15, 2002

(54) MOSFET DEVICE AND FABRICATION METHOD THEREOF

(75) Inventors: Seong-Jo Park, Choongcheongbuk-Do (KR); Yang-Soo Sung, Choongcheongbuk-Do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 9 days.

(21) Appl. No.: 09/631,954

(22) Filed: Aug. 3, 2000

(30) Foreign Application Priority Data

Aug. 9, 1999 (KR) .............................. 99-32551

(51) Int. Cl.[7] ...................... H01L 27/108; H01L 29/76; H01L 29/94; H01L 31/119
(52) U.S. Cl. ...................... 257/306; 257/307; 257/308; 257/396
(58) Field of Search .................. 257/306–309, 257/330, 296, 329, 331, 396

(56) References Cited

U.S. PATENT DOCUMENTS 5,789,289 A * 8/1998 Jeng ........................... 438/253
5,898,006 A   4/1999 Kudoh ........................ 438/275
5,920,094 A * 7/1999 Nam ........................... 257/347

* cited by examiner

Primary Examiner—Tom Thomas
Assistant Examiner—Thien F Tran
(74) Attorney, Agent, or Firm—Morgan, Lewis & Bockius LLP (57) ABSTRACT

A MOSFET device includes a gate formed on a multi-surface area of a semiconductor substrate formed of a first surface which is not etched, a second surface etched in parallel with the first surface, and a surface connecting the first and second surfaces. A source/drain region is formed below each of the first and second surfaces laterally adjacent to a gate prevailed on the matter surface. A first contact is formed of a conductive material formed on an upper surface of the source/drain region, and a second contact is formed of a conductive material formed on the gate, so that it is possible to prevent a punch through phenomenon, increase the integrity of the device, and decrease the contact resistance of a contact formed on the gate.

13 Claims, 7 Drawing Sheets

MOSFET DEVICE AND FABRICATION METHOD THEREOF

BACKGROUND OF THE INVENTION

1. Field of the Invention

The present invention relates to a semiconductor device and a fabrication method thereof, and in particular to a structure of a MOSFET (Metal Oxide Semiconductor Field Effect Transistor) device, a fabrication method thereof, and a structure of a memory cell implemented with the MOSFET device.

2. Description of the Background Art

Recently, as the degree of circuit integration of a semiconductor device has increased, the distance between the source and drain of a MOSFET device has decreased. When the distance between the source and drain decreases below a critical value, the sum of the depletion region of the source and the depletion region of the drain becomes the same as the distance between the source and drain which causes a punch through phenomenon. When the above-described punch through phenomenon occurs, the depletion regions of the source and drain contact each other so that it is impossible to control the current flowing in the MOSFET device.

Since the width of the depletion region is in inverse proportion to the concentration of the dopants, as the concentration of the dopants is increased, the width of the depletion region is decreased. Therefore, in order to overcome the above-described punch through problems, a punch through stopper has been ion-implanted to increase the concentration of dopants in the region in which a channel is formed between the source and the drain.

Figure 1:
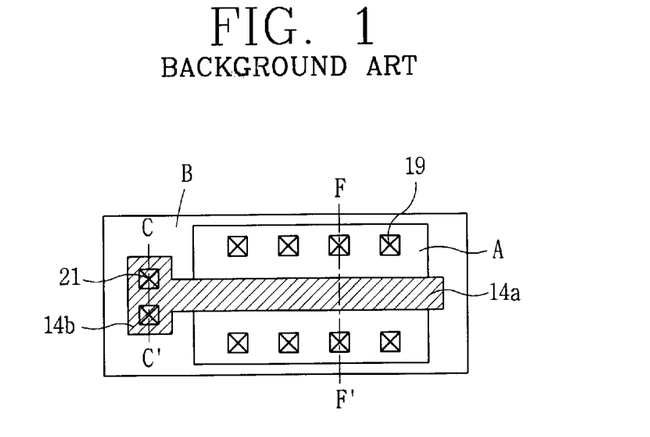
FIG. 1 is a plan view illustrating a conventional MOSFET device.

FIG. 1 is a plan view illustrating a conventional MOSFET device. As shown therein, an active region A and an isolation region B are defined. A first gate 14a traverses the active region A, and a second gate 14b is formed in the isolation region B. The first gate 14a and the second gate 14b are integrally connected. First contacts 19 are formed in the active region A at both sides of the first gate 14a. A second contact 21 is formed at the second gate 14b in the isolation region B.

Figure 2A:
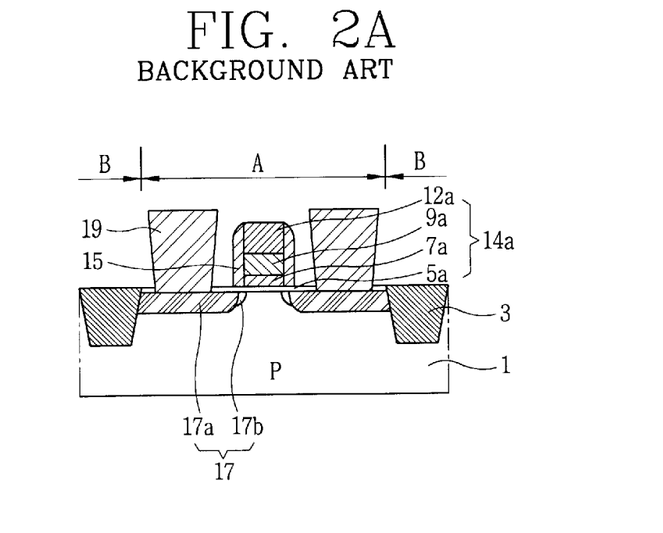
FIGS. 2A and 2B are cross-sectional views illustrating a conventional MOSFET device.

FIG. 2A is a cross-sectional view taken along line F-F' of FIG. 1. As shown therein, a field insulation layer 3 is formed in an upper portion of a p-type semiconductor substrate 1, and the region of the semiconductor substrate 1 is divided into an active region A and isolation regions B. A gate insulation film 5a, a polycrystal silicon film 7a, a silicide film 9a, and a capping insulation film 12a are sequentially formed on an upper surface of the active region A to form a first gate 14a. The capping insulation film 12a is formed in a multiple tier structure in which a nitride film is formed on an upper surface of an oxide film. Side wall spacers 15 are formed on both the lateral surfaces of the first gate. A source/drain region 17 is formed in such as manner that a donor is implanted into an upper portion of the p-type semiconductor substrate 1 between the first gate 14a and the field insulation layer 3. The source/drain region 17 is formed of a N+region 17a having a higher doping concentration and a N−region 17b having a lower doping concentration. A first contact 19 formed of a conductive material is formed on an upper surface of the source/drain region 17.

Figure 2B:
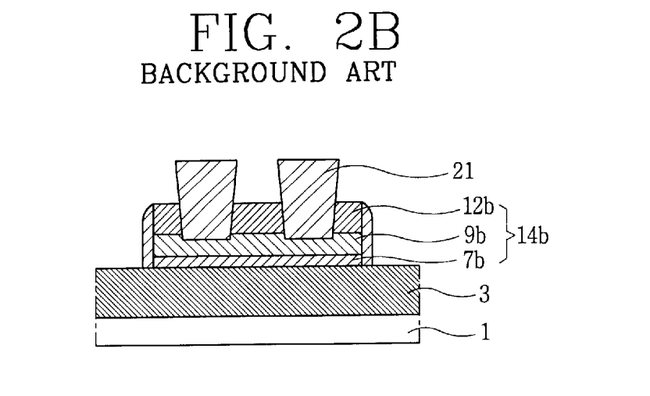

FIG. 2B is a cross-sectional view taken along line C-C' of FIG. 1. As shown therein, a second contact 21 formed of a conductive material is formed on an upper surface of the silicide film 9b which is exposed by patterning the capping insulation film 12b of the second gate 14b formed on the field insulation layer 3 which forms the insulation region B.

The conventional MOSFET device fabrication method will be explained with reference to FIGS. 3A through 3F.

Figure 3A:
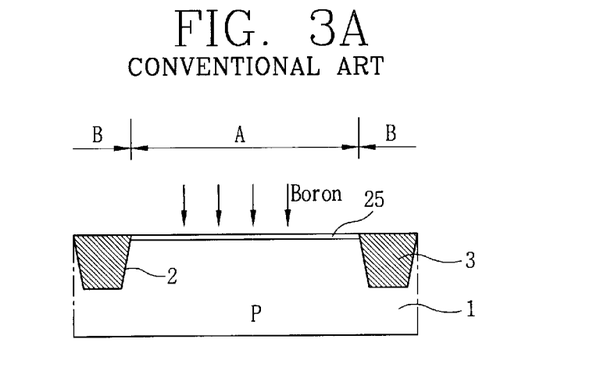
FIGS. 3A through 3F are cross-sectional views illustrating a conventional method for fabricating a MOSFET device.

As shown in FIG. 3A, a trench 2 is formed in the semiconductor substrate 1, and a field insulation layer 3 is filled into the trench 2. This divides the semiconductor substrate into an active region A and isolation regions B. A buffer oxide film 25 is formed on an upper surface of the p-type semiconductor substrate 1. Acceptors such as boron ions, which act as a punch through stopper, are implanted into an upper portion of the active region A of the semiconductor substrate 1. The buffer oxide film 25 is removed.

Figure 3B:
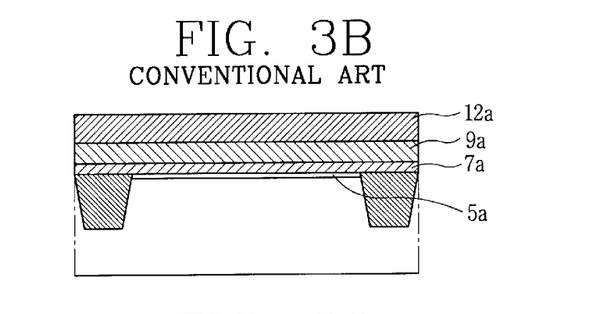

Next, as shown in FIG. 3B, a gate insulation film 5a, a polycrystal silicon film 7a, and a silicide film 9a are sequentially formed on an upper surface of the semiconductor substrate 1. Thereafter, an oxide film and a nitride film are sequentially formed on an upper surface of the silicide film 9a to form the capping insulation film 12a.

Figure 3C:
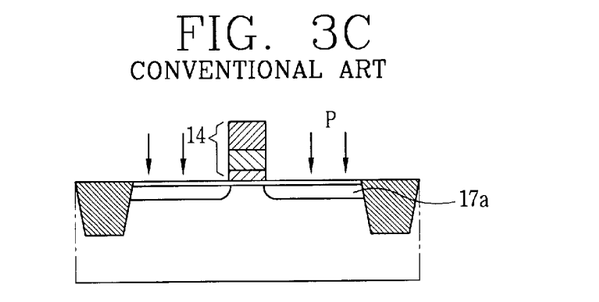

As shown in FIG. 3C, the capping insulation film 12a, the silicide film 9a, and the polycrystal silicon film 7a, which are formed on the semiconductor substrate 1, are sequentially patterned to form a first gate 14a. Donors such as phosphorus ions are implanted into the active region A of the semiconductor substrate 1 using the first gate 14a as a mask to form a N−region 17a.

Figure 3D:
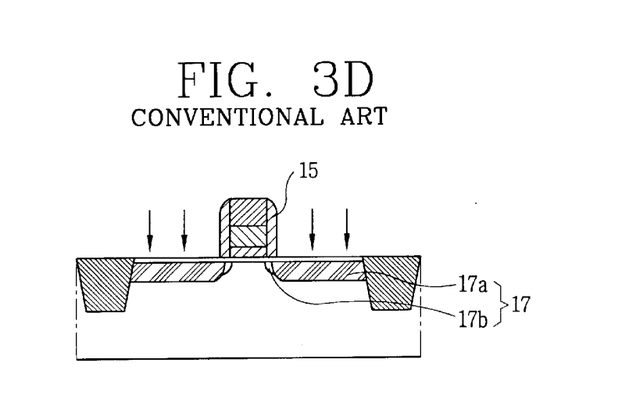

As shown in FIG. 3D, a nitride film is formed on the entire surfaces of the semiconductor substrate 1 including the first gate, and a side wall spacer 15 is formed on a lateral surface of the first gate 14a by performing an anisotropical etching operation without using a mask. Donors such as arsenic ions are implanted into the active region A of the semiconductor substrate using the first gate 14a and the side wall spacer 15 as a mask. Thereafter, a source/drain region 17 having a LDD (Low Doped Drain) structure of a N+region 17b having a higher doping concentration and a N−region 17a having a lower doping concentration are formed based on an annealing operation.

Figure 3E:
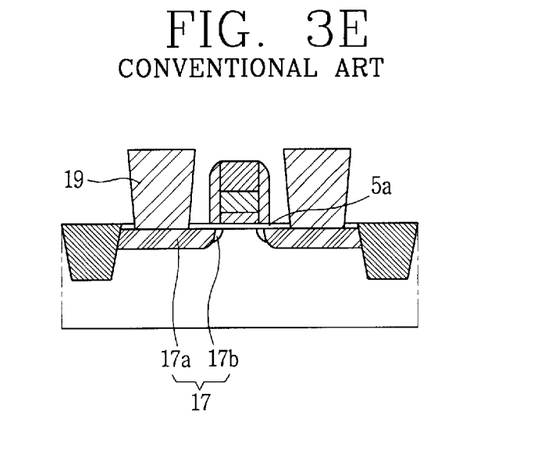

Next, as shown in FIG. 3E, the gate insulation film 5a is patterned so that a certain region of the upper surface of the source/drain region 17 is exposed. A first contact 19 formed of a conductive material is formed on an upper surface of the exposed source/drain region 17.

Figure 3F:
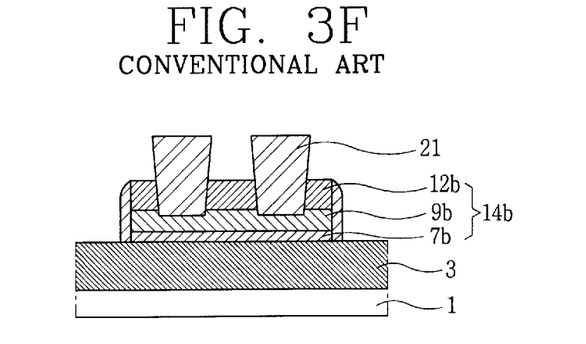

As shown in FIG. 3F, a capping insulation film 12b of the second gate 14b formed on the field insulation layer 3 is patterned, and a certain region of the silicide film 9b is exposed. A second contact 21 is formed on an upper surface of the exposed silicide film 9b. The second gate 14b and the first gate 14a are concurrently formed during the same process. In the conventional art, in order to prevent a punch through phenomenon, a punch through stopper is provided in the region in which the channel is formed. However, there is a certain limit for increasing the concentration of a punch through stopper at a region in which a channel is formed. Furthermore, since the source and drain are formed at the same depth, as the density of a device is increased, the margin of the device required for preventing the punch through phenomenon is decreased. Therefore, it is difficult to increase the density, i.e., the degree of integration, of a device.

SUMMARY OF THE INVENTION

Accordingly, it is an object of the present invention to provide a MOSFET device structure, a fabrication method thereof, and a memory cell which are capable of preventing a punch through phenomenon and which obtain a certain margin of a device which is required for enhancing the degree of integration of the device.

To achieve the above object, there is provided a MOSFET device comprising a semiconductor substrate having an active region, the active region including a first substrate surface at a first level of the substrate, a second substrate surface at a second level of the substrate, the second level being lower than the first level, and a third substrate surface extending from the second substrate surface to the first substrate surface, a first gate formed over the third substrate surface, source/drain regions formed in the first substrate surface and the second substrate surface laterally separated from the first gage, and first conductive contacts formed on the source/drain regions.

In another aspect, the present invention contemplates a method for fabricating a MOSFET device, comprising the steps of providing a substrate having a first surface, providing first and second insulation layers in the substrate to divide the substrate into a first active region between the first and second insulation layers and an isolation region outside of the insulation layers, etching an area of the active region of the semiconductor substrate to form a second surface etched in parallel with and below the first surface and a third surface extending from the second surface to the first surfaces, implanting a first conductivity type punch through stopper impurity into the first, second, and third surfaces of the semiconductor substrate, forming a first gate on the third surface of the semiconductor substrate, forming a source/drain regions by implanting a second conductivity type impurity into the first and second surfaces of the substrate in areas laterally adjacent to the first gate, exposing portions of the source/drain regions, and forming first contacts on an upper surface of the exposed portions of the source/drain regions.

The present invention further contemplates a memory cell comprising a substrate having a first surface, a first isolation region formed in the substrate and a second isolation region formed in the substrate, a first active region in the area between the first isolation region and the second isolation region, a second surface of the substrate formed in the active area and at a depth below the first surface of the substrate, a third surface of the substrate extending from the second surface to the first surface, a first gate formed over the third surface of the substrate, a side wall spacer formed on a lateral surface of the gate, source/drain regions formed below the first and second surfaces of the semiconductor substrate adjacent lateral surfaces of the first gate, and a storage node contact plug and a bit line plug formed on an upper surface of the source/drain regions.

Additional advantages, objects and features of the invention will become more apparent from the description which follows.

BRIEF DESCRIPTION OF THE DRAWINGS

The present invention will become more fully understood from the detailed description given below and the accompanying drawings, which are given by way of illustration only and are not limitative of the present invention, and wherein:

FIGS. 6A-1 through 6E-2 are cross-sectional views illustrating a method for fabricating a MOSFET device according to an embodiment of the present invention.

DETAILED DESCRIPTION OF THE PREFERRED EMBODIMENTS

Figure 4:
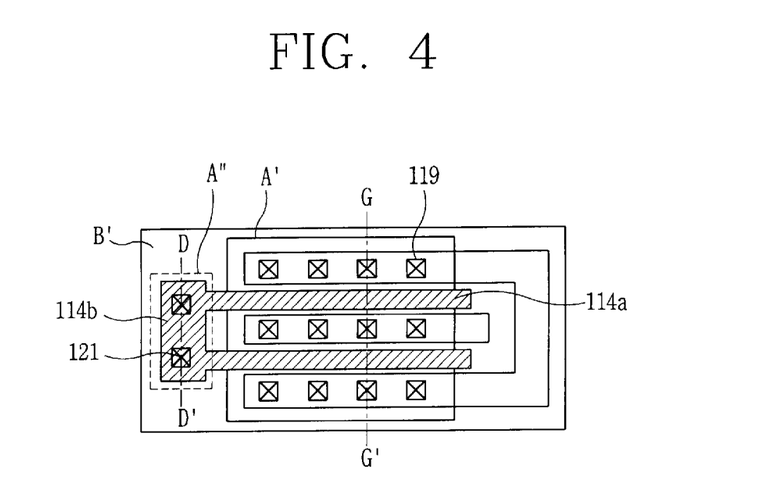
FIG. 4 is a plan view illustrating a MOSFET device according to an embodiment of the present invention.

FIG. 4 is a plan view illustrating a MOSFET device according to the present invention. As shown therein, a semiconductor substrate is divided into a first active region A', a second active region A", and an isolation region B'. A source/drain region is formed in the first active region A'. A first gate 114a traverses the first active region A'.

A second gate 114b is formed on the second active region A". The first gate 114a and the second gate 114b are connected above the isolation region B'. First contacts 119 are formed in the first active region A' along both sides of the first gate 114a. A second contact 121 is formed at the second gate 114b formed in the second active region A".

Figure 5A:
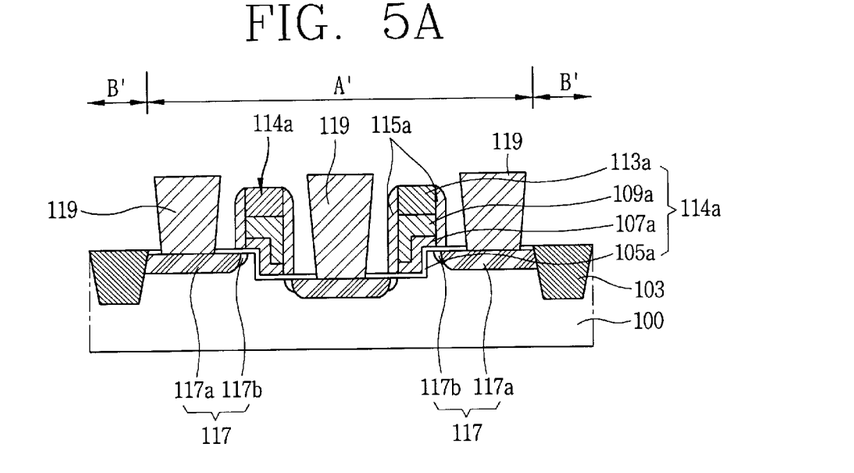
FIGS. 5A and 5B are cross-sectional views illustrating a MOSFET device according to an embodiment of the present invention.

FIG. 5A is a cross-sectional view taken along line G–G' of FIG. 4. As shown therein, a field insulation layer 103 is formed in an upper portion of a p-type semiconductor substrate 100, and the semiconductor substrate 100 to define a first active region A' and isolation regions B'. A certain portion of the semiconductor substrate 100 of the first active region A' is etched to a depth of 1000~3000 Å. This provides a semiconductor substrate having multi-surfaces including a first surface that is not etched, a second surface etched in parallel with the first surface, and vertical surfaces connecting the first and second surfaces. A first gate 114a composed of a capping layer 113a and a gate electrode comprising a gate insulation film 105a, a polycrystal silicon film 107a and a silicide film 109a is formed in a certain region over the multi-surface semiconductor substrate.

The capping insulation film 113a is a multiple tier structure in which an oxide film and a nitride film are sequentially formed. A side wall spacer 15a is formed on both the lateral surfaces of the first gate. Donors are implanted into a portion below the first surface between the first gate 114a and the field insulation layers 103.

Each source/drain region 117 is formed of a N+region 117a having a higher doping concentration and a N–region having a lower doping concentration. First contacts 119 formed of a conductive material are formed on an upper surface of the source/drain region 117.

Figure 5B:
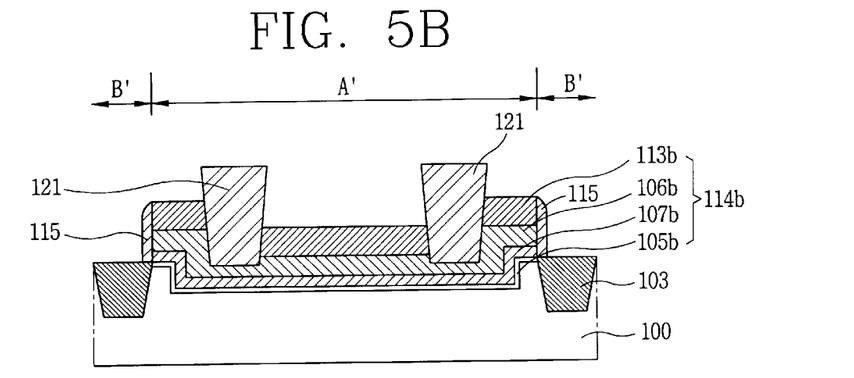

FIG. 5B is a cross-sectional view taken along ling D–D' of FIG. 4. As shown therein, a certain upper surface region of the semiconductor substrate of the second active region A" is etched to a depth of 1000~3000 Å, so that a semiconductor substrate has multi-surfaces including a first surface that is not etched, a second surface etched in parallel with the first surface, and vertical surfaces connecting the first and second surfaces.

In a certain region over the multi-surface semiconductor substrate is formed a second gate 114b composed of a capping layer 113b and a gate electrode comprising a gate insulation film 105b, a polycrystal silicon film 107b, and a silicide film 109b.

The capping insulation film 113b has a multiple tier structure in which an oxide film and a nitride film are sequentially formed. A side wall spacer 115 is formed on both the lateral surfaces of the second gate, and second contacts 121 formed of a conductive material are formed on an upper surface of the silicide film 109b exposed by patterning the capping insulation film 113b.

Figure 6A:
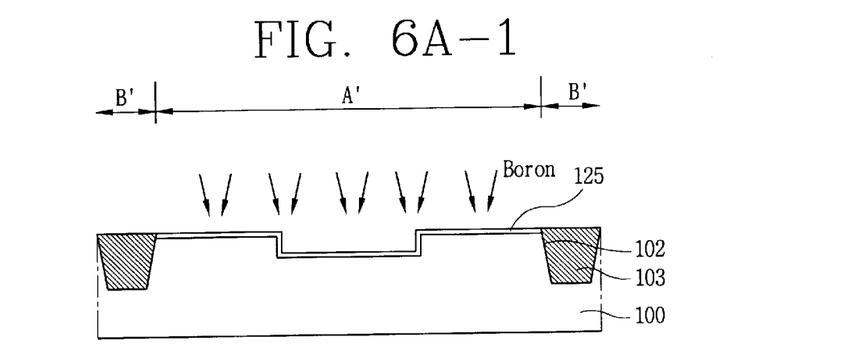

FIGS. 6A-1 through 6E-1 illustrate a method for fabricating a MOSFET device in a first active region A' according to the present invention, and FIGS. 6A-2 through 6E-2 illustrate a process for forming a second gate 114b and a second contact 121 on the second gate 114b.

As shown in FIG. 6A-1, trenches 102 are formed in the semiconductor substrate 100, and field insulation layers 103 are filled into the trenches 102. The semiconductor substrate is divided into a first active region A' and isolation regions B'. A semiconductor substrate having multi-surfaces formed of a first surface which is not etched, a second surface etched in parallel with the first surface, and at least one vertical surface connecting the first and second surfaces is fabricated by etching a certain region of the surface of the active region A' to a depth of 1000~3000 Å. A buffer oxide film 125 is formed on the multi-surfaces of the p-type semiconductor substrate 100. Acceptors such as boron ions, which act as a punch through stopper, are implanted into a front surface of the active region A' of the semiconductor substrate 100.

At this time, the acceptor is implanted at an angle of 30°~50° in the direction perpendicular to the first surface, so that the acceptor is uniformly implanted into the first and second surfaces and the surfaces connecting the first and second surfaces. The buffer oxide film 125 is removed after the acceptor is implanted.

Figure 6A:
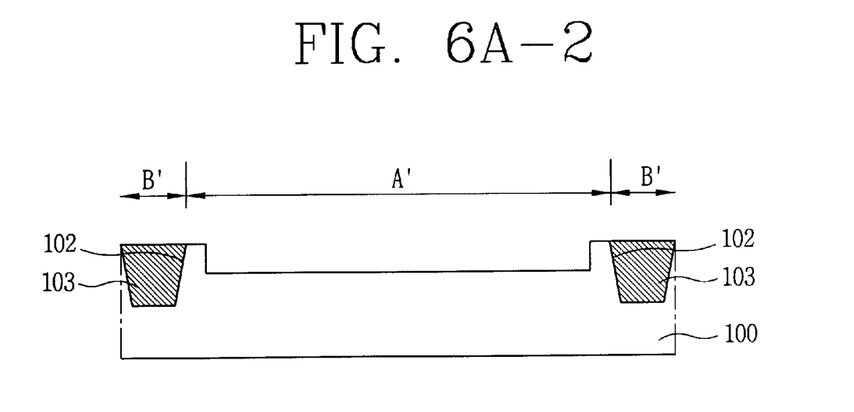

When performing the process shown in FIG. 6A-1, the process of FIG. 6A-2 is performed with respect to the second active region A". Trenches 102 are formed in the semiconductor substrate 100, and field insulation layers 103 are filled into the trenches 102 so that the semiconductor substrate is divided into a second active region A" and isolation regions B'. Next, as described with regard to FIG. 6A-1, an area of the semiconductor substrate is etched to a depth of 1000~3000 Å. The buffer oxide film formed when the buffer oxide of FIG. 6A-1 is also formed over the area A".

Figure 6B:
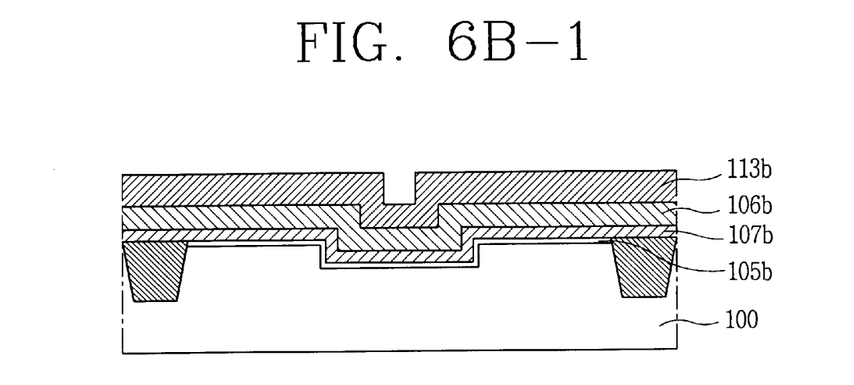
Figure 6B:
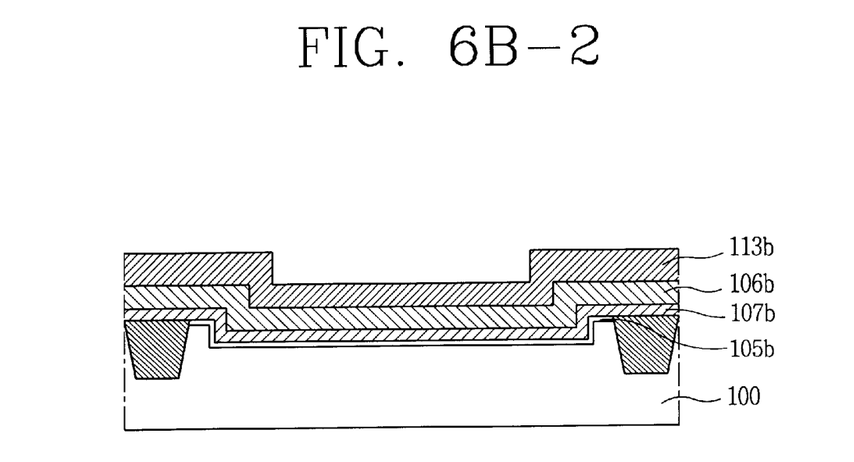

Next, as shown in FIGS. 6B-1 and 6B-2, gate insulation films 105a and 105b, polycrystal silicon films 107a and 107b, and silicide films 109a and 109b are sequentially formed on the multi-surfaces of the semiconductor substrate 100. Capping insulation films 113a and 113b are formed by sequentially forming an oxide film and a nitride film on an upper surface of the silicide film 109a.

Figure 6C:
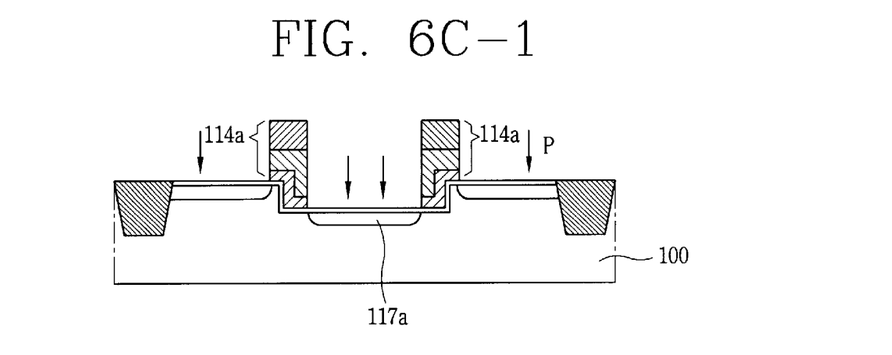

As shown in FIG. 6C-1, the capping insulation film 113a, the silicide film 109a, and the polycrystal film 107a formed on the semiconductor substrate 100 are sequentially patterned to form a first gate 114a. Donors such as phosphorus ions are implanted into the first active region A' of the semiconductor substrate 100 using the first gate 114a as a mask to form an N-region 117a.

Figure 6C:
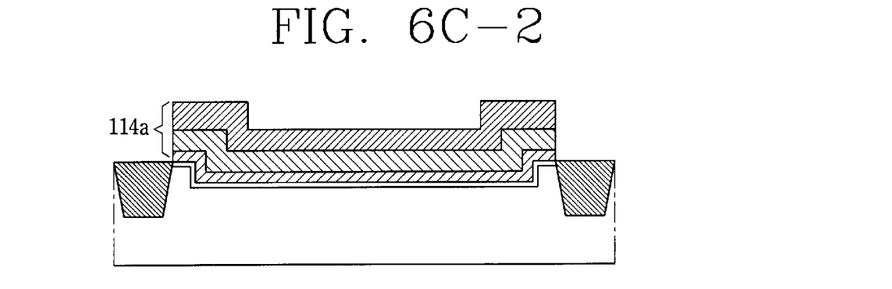

As shown in FIG. 6C-2, at the time of forming the first gate 114a at the first active region A', the second gate 114b is formed at the second active region A".

Figure 6D:
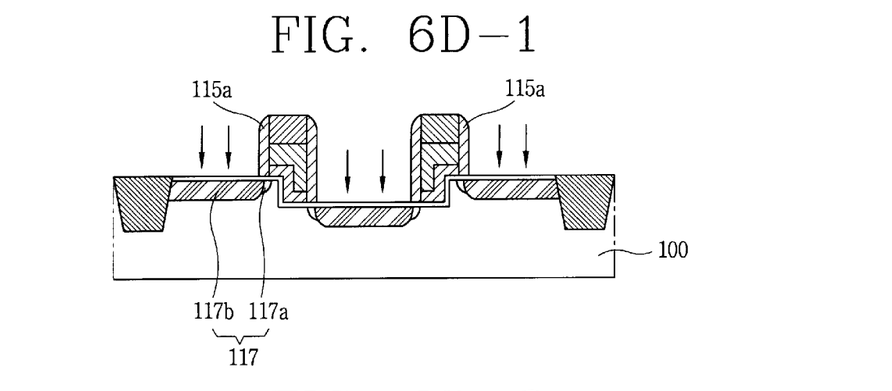

As shown in FIG. 6D-1, a nitride film is formed on a upper surface of the semiconductor substrate 100 including the first gate 114a and is anisotropically etched without using a mask, so that side wall spacers 115a are formed on both the lateral surfaces of the first gate 114a. Donors such as arsenic ions are implanted into the first active region A' of the semiconductor substrate 100 using the first gate 114a and the side wall spacers 115a as a mask. Thereafter, the resultant structure is annealed, so that source/drain region 117 is formed having a LDD (Low Doped Drain) structure formed of a N+region 117b of a higher doping concentration and a N−region 117a of a lower doping concentration.

Figure 6D:
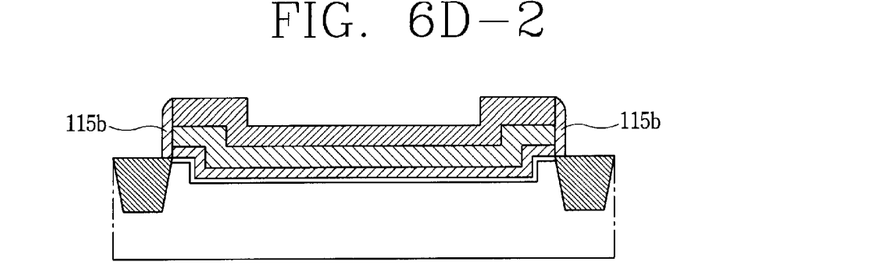

As shown in FIG. 6D-2, when forming the side wall spacers 115a on both the lateral surfaces of the first gate 114a formed in the first active region A', side wall spaces 115b are formed on both the lateral surfaces of the second gate 114b formed in the second active region A".

Figure 6E:
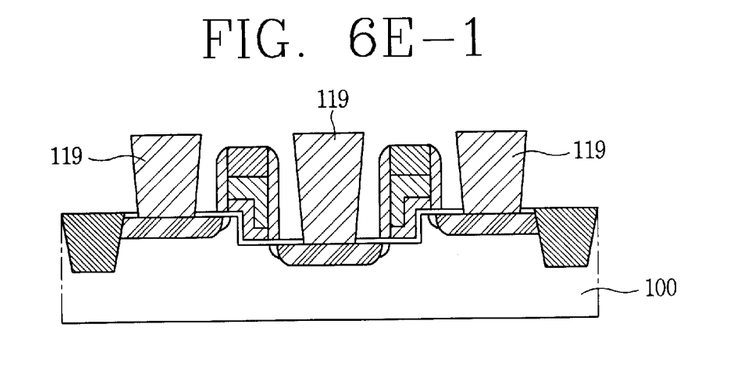

As shown in FIG. 6E-1, the gate insulation film 105a is patterned so that certain surface regions of the source/drain regions 117 are exposed. Thereafter, the first contacts 119 formed of a conductive material are formed on upper surfaces of the exposed source/drain regions 117.

Figure 6E:
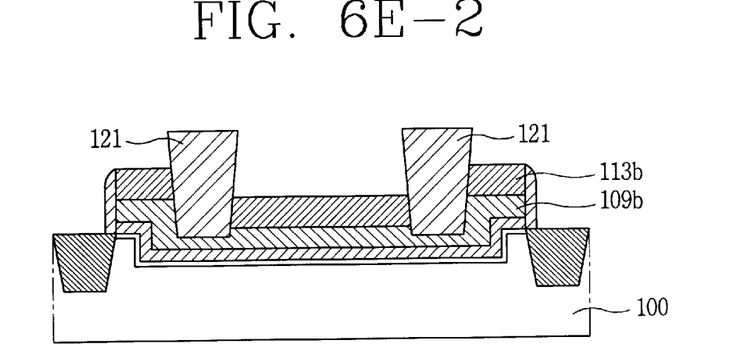

As shown in FIG. 6E-2, certain regions of the silicide film 109b are exposed by patterning the capping insulation film 113b of the second gate. At this time, the exposed region of the silicide film 109b has multi-surfaces. Second contacts 121 formed of a conductive material are formed on the silicide film 109b of the exposed multi-surfaces. The second contacts are formed in contact with the silicide film at the multi-surfaces.

Figure 7:
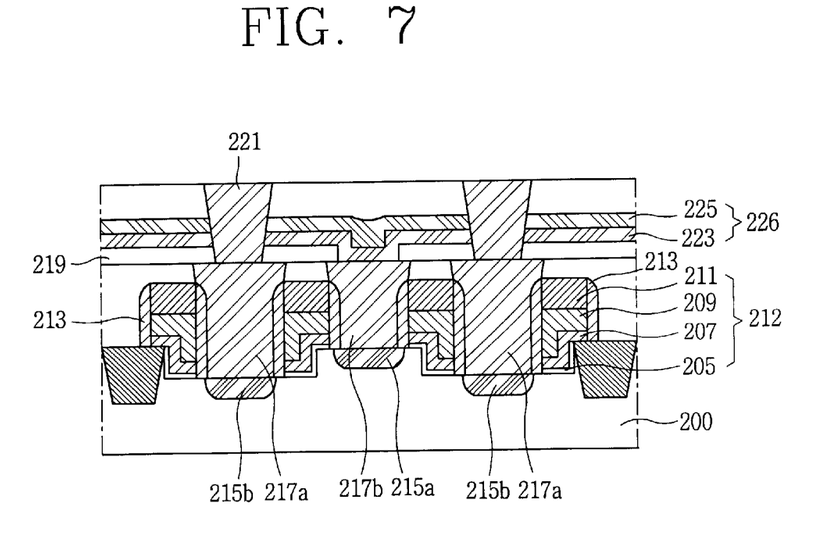
FIG. 7 is a cross-sectional view illustrating a memory cell according to an embodiment of the present invention.

FIG. 7 illustrates a memory cell comprising using a MOSFET device according to the present invention. A semiconductor substrate including multi-surfaces formed of a first surface which is not etched, a second surface etched in parallel with the first surface, and at least one surface connecting the first and second surfaces is formed by etching a certain surface region of the p-type semiconductor substrate 200. A gate 212 formed by sequentially stacking a gate insulation film 205, a polycrystal silicon film 207, a silicide film 209, and a capping insulation film 211 is formed at a certain region of the multi-surfaces of the semiconductor substrate. The gate 212 contacts with the multi-surfaces of the semiconductor substrate 200. Side wall spacers 213 formed of a nitride film are formed on both the lateral surfaces of the gate. A first source/drain region 215a is formed on an upper portion of the semiconductor substrate corresponding to a portion below the first surface. In addition, a second source/drain region is formed on the semiconductor substrate corresponding to a portion below the second surface. A storage node contact plug 217a is formed on an upper surface of the second source/drain region 215b. A bit line plug 217b is formed on an upper surface of the first source/drain region 217a. A storage node contact 221 is formed on an upper surface of the storage node contact plug exposed by patterning an interlayer insulation film 219. A bit line 226 formed by stacking a polycrystal silicon film 223 and a silicide film 225 is connected with the bit line plug 217b via a hole formed by patterning the interlayer insulation film 219.

While the above method forms a NMOSFET, the method may be adapted to form a PMOSFET or CMOSFET.

As described above, in the structure of a MOSFET device and a fabrication method thereof according to the present invention, the source and drain formed on the semiconductor substrate have a step formed of different heights. As a result, it is possible to prevent a short channel effect problem due to a punch through which is formed as the integrity of the semiconductor device is increased.

In addition, in the present invention, since a channel is formed on lateral walls of a groove formed by etching the surfaces of a semiconductor device, the length of the channel is increased compared to the conventional art. As a result, it is possible to prevent a short channel effect problem. Therefore, in the present invention, it is possible to fabricate a MOSFET device having the same channel length as the conventional art and a smaller gate width, so that the integrity of the MOSFET device is increased.

In the present invention, the second contacts formed on the gate are in contact with the multi-surfaces of the silicide of the gate. Therefore, even when the size of the contact hole formed on the gate is the same as for a conventional method, since the contact area where the second contact and the second gate electrode contact each other is increased, it is possible to decrease the contact resistance between the gate and the second contact. In addition, when incorporating the MOSFET device in a memory cell, it is possible to increase cell efficiency by decreasing the size of a memory cell transistor.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A MOSFET device comprising:
   a semiconductor substrate having an active region, the active region including a first substrate surface at a first level of the substrate, a second substrate surface at a second level of the substrate, the second level being lower than the first level, and a third substrate surface extending from the second substrate surface to the first substrate surface;
   a first gate formed over the third substrate surface;
   source/drain regions formed in the first substrate surface and the second substrate surface laterally separated from the first gate; and
   first conductive contacts formed on the source/drain regions, wherein the substrate further comprises a second active region, the second active region including:
      a fourth substrate surface at a third level of the substrate, the third level being lower than the first level;
      a fifth substrate surface extending from the fourth substrate surface to the first substrate surface;
      a second gate formed over the fifth substrate surface, the second gate being integrally formed with the first gate; and
      a second conductive contact formed on the second gate.

2. A MOSFET device according to claim 1, wherein the second substrate surface comprises an etched area of the substrate.

3. A MOSFET device according to claim 2, wherein the second surface of the semiconductor substrate is 1000~3000 Å below the first substrate surface.

4. A MOSFET device according to claim 2, wherein the first and second gates include a gate electrode comprising a gate insulation film, a polycrystal silicon film on the gate insulation film, a silicide film on the polycrystal silicon film, and a capping insulation film on the silicide film.

5. A MOSFET device according to claim 2, wherein the source/drain regions are formed of a second conductive type impurity at a first doping concentration and a second impurity region doped with the second conductive type impurity at a second doping concentration lower than the first doping concentration.

6. A MOSFET device comprising:
   a substrate having a first surface;
   a first isolation region formed in the substrate and a second isolation region formed in the substrate;
   a first active region in the area between the first isolation region and the second isolation region;
   a second surface of the substrate formed in the first active region and at a depth below the first surface of the substrate;
   a third surface of the substrate extending from the second surface to the first surface;
   a first gate formed over the third surface of the substrate;
   source/drain regions formed in the first substrate surface and the second substrate surface laterally separated from the first gate; and
   first conductive contacts formed on the source/drain regions, wherein the substrate further comprises a second active region, the second active region including:
      a fourth surface of the substrate being lower than the first substrate surface;
      a fifth surface of the substrate extending from the fourth substrate surface to the first substrate surface;
      a second gate formed over the fifth substrate surface, the second gate being integrally formed with the first gate; and
      a second conductive contact formed on the second gate.

7. A MOSFET device according to claim 6, wherein the second substrate surface comprises an etched area of the substrate.

8. A MOSFBT device according to claim 6, wherein the second surface of the semiconductor substrate is 1000~3000 Å below the first substrate surface.

9. A MOSFET device according to claim 6, wherein the first and second gates include a gate electrode comprising a gate insulation film, a polycrystal silicon film on the gate insulation film, a silicide film on the polycrystal silicon film, and a capping insulation film on the sulicide film.

10. A MOSFBT device according to claim 6, wherein the source/drain regions are formed of a second conductive type impurity at a first doping concentration and a second impurity region doped with the second conductive type impurity at a second doping concentration lower than the first doping concentration.

11. A memory cell, comprising:
   a substrate having a first surface;
   a first isolation region formed in the substrate and a second isolation region formed in the substrate;
   a first active region in the area between the first isolation region and the second isolation region;
   a second surface of the substrate formed in the first active region and at a depth below the first surface of the substrate;
   a third surface of the substrate extending from the second surface to the first surface;
   a first gate formed over the third surface of the substrate;
   a side wall spacer formed on a lateral surface of the gate;
   source/drain regions formed below the first and second surfaces of the substrate adjacent lateral surfaces of the first gate;
   a storage node contact plug and a bit line plug formed on an upper surface of the source/drain regions;
   wherein the substrate further comprises a second active region, the second active region including:
      a fourth surface of the substrate being lower than the first substrate substrate surface;
      a fifth surface of the substrate extending from the fourth substrate surface to the first substrate surface;
      a second gate formed over the fifth substrate surface, the second gate being integrally formed with the first gate;
      a conductive. contact formed on the second gate.

12. A memory cell according to claim 11, further comprising:
   a storage node contact connected with the storage node contact plug via an interlayer insulation film; and
   a bit line connected with the bit line plug via the interlayer insulation film.

13. A memory cell according to claim 12, wherein the second substrate surface comprises an etched area of the substrate, and wherein the second surface of the semiconductor substrate is 1000~3000 Å below the first substrate surface.

* * * * *